(12) United States Patent
Raaf et al.

(10) Patent No.: US 9,467,158 B1
(45) Date of Patent: Oct. 11, 2016

(54) APPARATUS AND A METHOD FOR PROVIDING OSCILLATOR SIGNALS

(71) Applicant: Intel IP Corporation, Santa Clara, CA (US)

(72) Inventors: Bernhard Raaf, Neuried (DE); Zdravko Boos, Munich (DE); Stefan Meier, Neubiberg (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/045,783

(22) Filed: Feb. 17, 2016

(30) Foreign Application Priority Data

Mar. 26, 2015 (DE) .................. 10 2015 104 672

(51) Int. Cl.
*H03M 1/20* (2006.01)
*H03M 1/08* (2006.01)
*H03M 1/68* (2006.01)
*H03M 1/82* (2006.01)

(52) U.S. Cl.
CPC .............. *H03M 1/08* (2013.01); *H03M 1/68* (2013.01); *H03M 1/82* (2013.01)

(58) Field of Classification Search
CPC ........... H03M 1/08; H03M 1/68; H03M 1/82
USPC ........................................ 341/131, 143, 144
See application file for complete search history.

(56) References Cited

U.S. PATENT DOCUMENTS

| | | | | |
|---|---|---|---|---|
| 8,462,840 B2 * | 6/2013 | Chen | ............... | H03M 1/661 375/239 |
| 9,209,958 B1 * | 12/2015 | Palaskas | ............... | H04B 17/21 |
| 2015/0091384 A1 * | 4/2015 | Madoglio | ............... | H02J 17/00 307/104 |

* cited by examiner

*Primary Examiner* — Khai M Nguyen
(74) *Attorney, Agent, or Firm* — Eschweiler & Associates, LLC

(57) ABSTRACT

An apparatus for providing oscillator signals includes a first digital-to-time converter module configured to generate a first oscillator signal based on a first adapted input signal, a second digital-to-time converter module configured to generate a second oscillator signal; and a first processing module configured to generate the first adapted input signal of the first digital-to-time converter module by adding noise to a first input signal.

25 Claims, 9 Drawing Sheets

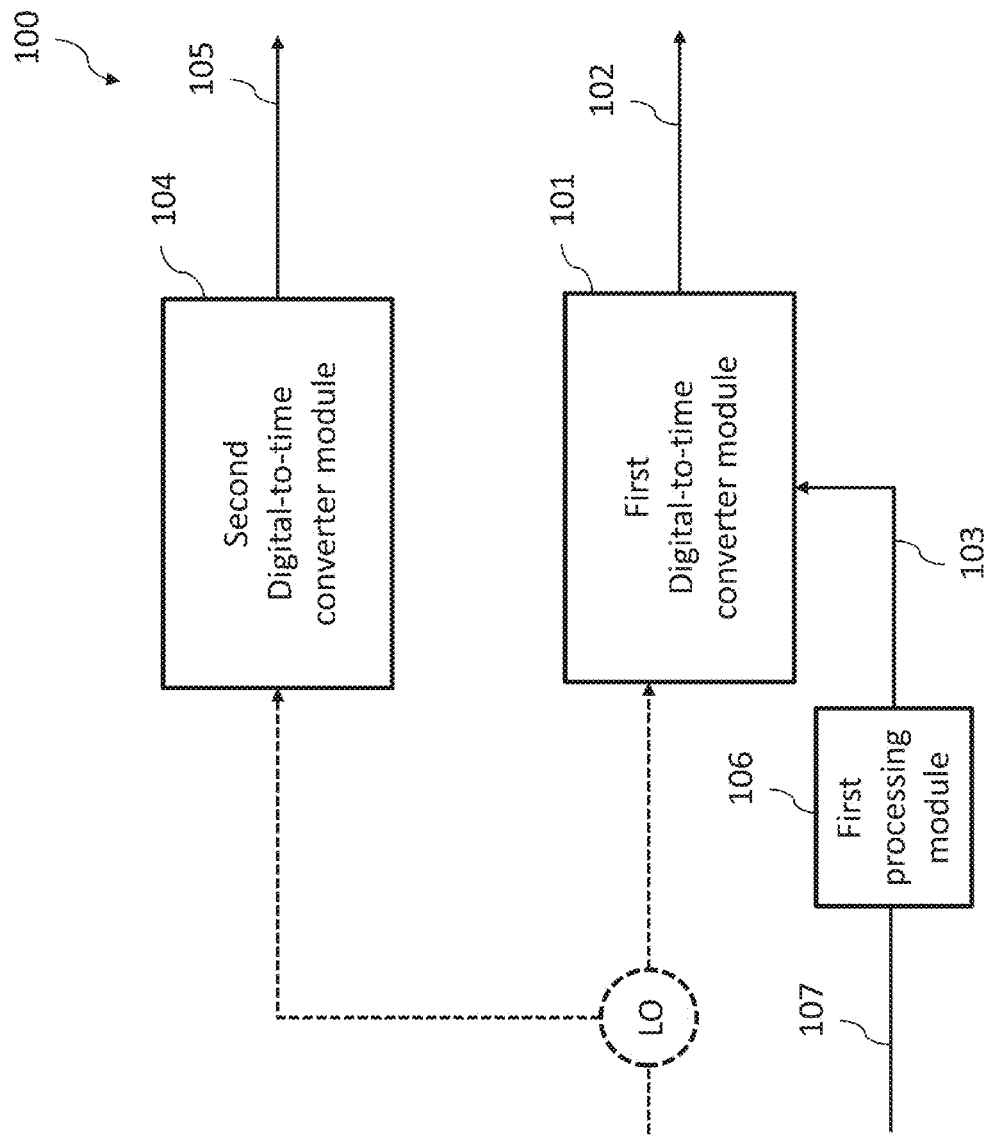

APPARATUS AND A METHOD FOR PROVIDING OSCILLATOR SIGNALS

CROSS REFERENCE TO RELATED APPLICATIONS

This application claims priority to German Application number 10 2015 104 672.5, filed on Mar. 26, 2015, the contents of which are herein incorporated by reference in its entirety.

FIELD

The present disclosure relates to the generation of required oscillator signals and in particular to an apparatus and a method for providing oscillator signals.

BACKGROUND

The demand on ever increasing amounts of data to be transmitted in short time causes higher requirements with respect to the transmit signals. Nowadays transceivers can transmit signals simultaneously at different frequencies. Therefore, several oscillator signals with different frequencies are required. Further, it is desired to improve the control over disturbances and interferences within transmit signals to meet desired limits.

BRIEF DESCRIPTION OF THE DRAWINGS

Some examples of apparatuses and/or methods will be described in the following by way of example only, and with reference to the accompanying figures, in which FIG. 1A shows a schematic illustration of an apparatus for providing oscillator signals;

DETAILED DESCRIPTION

Figure 1B:
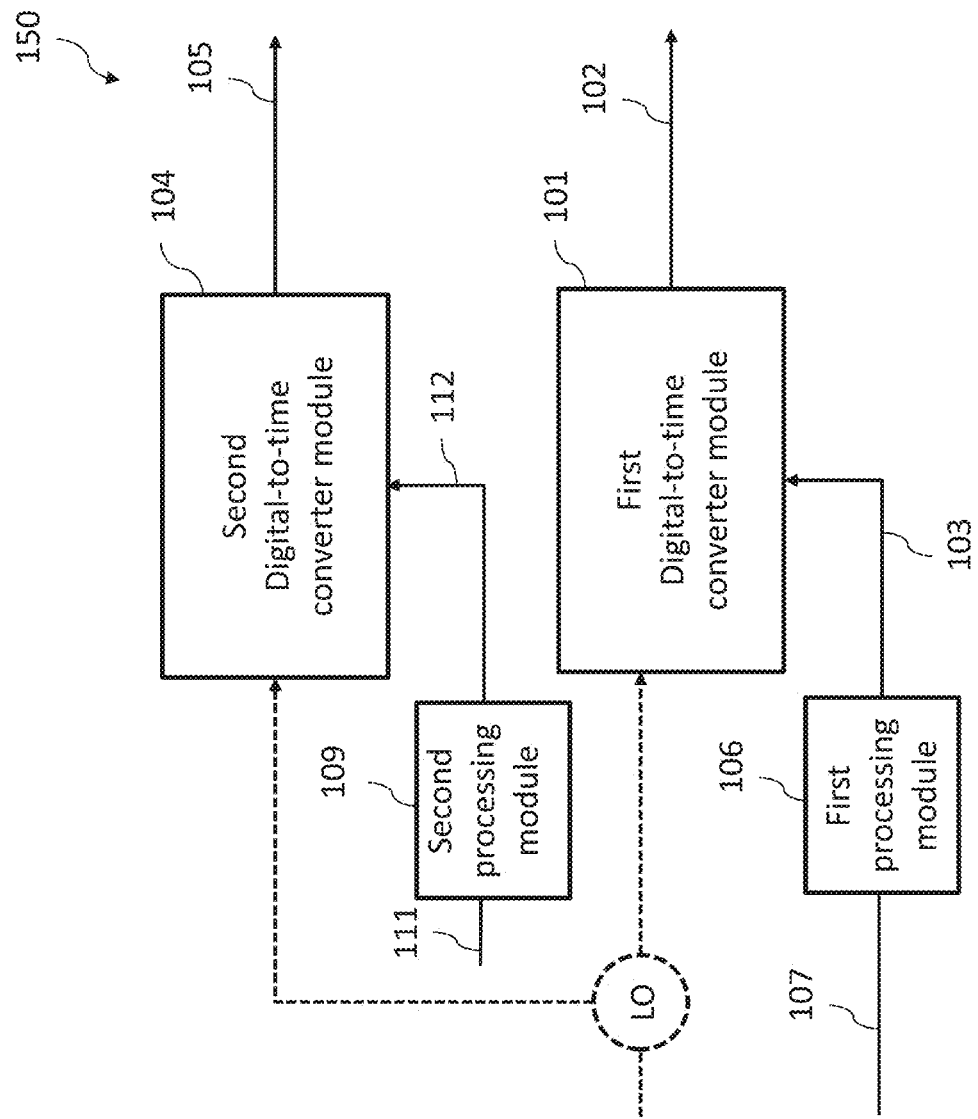
FIG. 1B shows a schematic illustration of a further apparatus for providing oscillator signals.

Various examples will now be described more fully with reference to the accompanying drawings in which some examples are illustrated. In the figures, the thicknesses of lines, layers and/or regions may be exaggerated for clarity.

Accordingly, while examples are capable of various modifications and alternative forms, the illustrative examples in the figures will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing illustrative examples only and is not intended to be limiting. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

In the following, various examples relate to devices (e.g. cell phone, base station) or components (e.g. transmitter, transceiver) of devices used in wireless or mobile communications systems. A mobile communication system may, for example, correspond to one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (E-UTRAN), Long Term Evolution (LTE) or LTE-Advanced (LTE-A), or mobile communication systems with different standards, e.g. Worldwide Interoperability for Microwave Access (WIMAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. The terms mobile communication system and mobile communication network may be used synonymously.

The mobile communication system may comprise a plurality of transmission points or base station transceivers operable to communicate radio signals with a mobile transceiver. In these examples, the mobile communication system may comprise mobile transceivers, relay station transceivers and base station transceivers. The relay station transceivers and base station transceivers can be composed of one or more central units and one or more remote units.

A mobile transceiver or mobile device may correspond to a smartphone, a cell phone, User Equipment (UE), a laptop, a notebook, a personal computer, a Personal Digital Assistant (PDA), a Universal Serial Bus (USB)-stick, a tablet computer, a car, etc. A mobile transceiver or terminal may also be referred to as UE or user in line with the 3GPP terminology. A base station transceiver can be located in the fixed or stationary part of the network or system. A base station transceiver may correspond to a remote radio head, a transmission point, an access point, a macro cell, a small cell, a micro cell, a pico cell, a femto cell, a metro cell etc. The term small cell may refer to any cell smaller than a macro cell, i.e. a micro cell, a pico cell, a femto cell, or a metro cell. Moreover, a femto cell is considered smaller than a pico cell, which is considered smaller than a micro cell. A base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

The mobile communication system may be cellular. The term cell refers to a coverage area of radio services provided by a transmission point, a remote unit, a remote head, a remote radio head, a base station transceiver, relay transceiver or a NodeB, an eNodeB, respectively. The terms cell and base station transceiver may be used synonymously. In some examples a cell may correspond to a sector. For example, sectors can be achieved using sector antennas, which provide a characteristic for covering an angular section around a base station transceiver or remote unit. In some examples, a base station transceiver or remote unit may, for example, operate three or six cells covering sectors of 120° (in case of three cells), 60° (in case of six cells) respectively. Likewise a relay transceiver may establish one or more cells in its coverage area. A mobile transceiver can be registered or associated with at least one cell, i.e. it can be associated to a cell such that data can be exchanged between the network and the mobile in the coverage area of the associated cell using a dedicated channel, link or connection. A mobile transceiver may hence register or be associated with a relay station or base station transceiver directly or indirectly, where an indirect registration or association may be through one or more relay transceivers.

If two or more digital-to-time converters (DTC) operate simultaneously, they may interfere with each other. For example, if two DTCs happen to be switching at the same time, they may both cause a load on the supply voltage (VCC) which impacts or influences the voltage being supplied to the other DTC. This may cause ripples in the supply voltage (VCC) which may affect one or both digital-to-time converter modules. Similarly, one or both DTCs may suffer from the ripples generated by the other DTC. For example, a reduced supply voltage may be supplied to one or both DTCs which may impact their operation as this may result in a delay in the DTC output. If such delays happen regularly, e.g. due to a regular beating (or coinciding) of the frequencies generated by two DTCs, this regular timing error may cause spurs in the output spectrum.

FIG. 1 shows a schematic illustration of an apparatus 100 for providing oscillator signals. The apparatus 100 includes a first digital-to-time converter module 101 configured to generate a first oscillator signal 102 based on a first adapted input signal 103. The apparatus 100 includes a second digital-to-time converter module 104 configured to generate a second oscillator signal 105. The apparatus 100 further includes a first processing module 106 configured to generate the first adapted input signal 103 of the first digital-to-time converter module by adding noise to a first input signal 107.

Due to the first processing module 106 adding noise to the first input signal 107 to generate the first adapted input signal 103, a reduction in spurs and oscillator signals with more accurate time delay may be produced by the two digital-to-time converter modules. Adding noise to the first input signal may lead to a temporal (i.e. time) variation or temporal deviation of processes (e.g. delay processes) carried out by the first digital-to-time converter module 101, which may avoid or reduce coincidences between signal provided by the first digital-to-time converter module 101 and the second digital-to-time converter module 104. This may lead to interference between the first digital-to-time converter module 101 and the second digital-to-time converter module 104 being reduced or minimized, for example. Furthermore it may avoid or reduce regularly recurring deviations and thus avoid or reduce spurs, for example.

The first digital-to-time converter module 101 may be configured to provide (or generate) the first oscillator signal 102 at an output interface of the first digital-to-time converter module 101. The provided (or generated) first oscillator signal 102 may have a (first) variable temporal delay with respect to a reference oscillator signal (e.g. a local oscillator signal having a reference frequency) provided at an input interface of the first digital-to-time converter module 101, for example. The first digital-to-time converter module 101 may apply a (first) variable temporal delay to the reference oscillator signal using temporal delay modules of the first digital-to-time converter module 101 in order to generate the first oscillator signal 102.

The second digital-to-time converter module 104 may be configured to provide (or generate) a second oscillator signal 105 at an output interface of the second digital-to-time converter module 104. The provided (or generated) second oscillator signal 105 may have a (second) variable temporal delay with respect to the reference oscillator signal (e.g. the local oscillator signal having the reference frequency) provided at an input interface of the second digital-to-time converter module 104, for example. The second digital-to-time converter module 104 may apply a (second) variable temporal delay to the reference oscillator signal using temporal delay modules of the second digital-to-time converter module 104 in order to generate the second oscillator signal 105.

A variable temporal delay may refer to the provided oscillator signal (e.g. the first oscillator signal and/or the second oscillator signal respectively) being delayed in time with respect to the reference oscillator signal or with respect to a signal derived from the reference oscillator signal. For example, the provided first oscillator signal 102 may have a (first oscillator) frequency different from a frequency of the reference oscillator signal, and the provided second oscillator signal may have a (second oscillator) frequency different from a frequency of the reference oscillator signal.

The first digital-to-time converter module 101 may be configured to receive the first adapted input signal 103, which may be based on the first input signal 107 with the added noise. The first input signal 107 may be a digital signal which includes successive control bit sequences for controlling a variable temporal delay of the first digital-to-time converter module 101, for example. For example, each control bit sequence may provide (or carry) information to the first digital-to-time converter module 101 on a variable temporal delay desired in the provided first oscillator signal 102. On top of (e.g. in addition to) the variable temporal delay there may be a non-variable i.e. constant delay as well. This delay does not generate spurs or other signal degradations, but may need to be considered for timing critical signals e.g. ranging signals, for example.

The input signal may correspond to a phase signal of a polar representation of a baseband transmit signal, for example.

The added noise may lead to a deviation, change or error of at least one bit of the control bit sequences of the first input signal which includes information for setting a temporal delay, for example. For example, the added noise may affect a conversion of the control bits to a delayed output such that deviations or errors in the order of one or more bits of the control bit sequences may occur. The deviations or errors may occur in the order of one or more least significant bits, for example. Alternatively or additionally, the deviations or errors may occur in the order of one or more most significant bits. The digital representation of the adapted input signal 103 may deviate from the digital representation of the (initial) input signal 107 by at least an amount equivalent to one least significant bit (LSB) of the input signal 107, for example. This may affect other bits (e.g. most significant bits), due to carry effects, for example.

The at least one bit of the control bit sequences may be changed by a random or a pseudo-random number to add the noise, for example. Thus an initial (desired) variable temporal delay based on the first input signal 107 may be changed to an adapted (desired) variable temporal delay based on the first adapted input signal 103 due to the added noise.

For example, noise may be added only to the first input signal 107 giving the first adapted input signal 103 so that a variable temporal delay of only the first digital-to-time converter module 101 is changed to the adapted variable temporal delay based on the added noise. For example, the apparatus may include a second processing module configured to provide a second input signal to the second digital-to-time converter module 104. The second digital-to-time converter module 104 may be configured to provide the second oscillator signal based on the second input signal. The second input signal may be free from added noise, for example. This may lead to only a single noise generation circuitry and a single processing module 106 being required, for example. Optionally, the second input signal 111 may be provided directly to the second digital-to-time converter module 104 without any intermediate processing modules (e.g. without the second processing module in between), for example.

Alternatively or optionally, noise may also be added to a second input signal which may be a digital signal which includes successive control bit sequences for controlling a variable temporal delay of the second digital-to-time converter module 104, for example. In other words, noise may be added to input signals (e.g. to each of the first input signal 107 and the second input signal) for both the first digital-to-time converter module 101 and the second digital-to-time converter module 104 respectively. In this way, a higher de-correlation of the timings of the first oscillator signal 102 and second oscillator signal 105 may be achieved, at a same noise level added to each of the input signals. In other words to reach the same de-correlation by adding noise only to a single input signal, that noise would need to be selected with higher magnitude i.e. with higher noise power, causing also more undesirable degradation to the affected signal e.g. the first oscillator signal 102, for example. By splitting the burden on both oscillator signals, a lower degradation may be achieved for each of them. In a further refinement the noise can be distributed unequally among the two (or more) signals, depending on noise tolerances of the two signals. The noise affecting the signal, which is able to tolerate higher distortions, may be selected to have higher magnitude or power than the noise added to the other signal, for example. The noise power may be selected to increase with or be proportional to the noise tolerance of the respective signals.

FIG. 1B shows an example of a further apparatus 150 for providing oscillator signals according to an example.

The further apparatus 150 may include one or more or all of the features of apparatus 100. Additionally or optionally, noise may also be added to the second input signal 111 to generate the second adapted input signal 112. For example, the second processing module 109 may be configured to generate the second adapted input signal 112 by adding noise to the second input signal 111. The second digital-to-time converter module 104 may be configured to provide the second oscillator signal 105 based on the second adapted input signal 112, for example.

The second digital-to-time converter module 104 may be similar or identical to the first digital-to-time converter module 101 in terms of structure and function. Furthermore, the second input signal 111 and the second adapted input signal 112 may each include similar functions and features as the first input signal 107 and the first adapted input signal 103 respectively. Optionally or alternatively, the implementation of the second digital-to-time converter module 104 may also differ from the first digital-to-time converter module 101. Nonetheless there may still be an undesired spur due to regular interference e.g. due to VCC ripples, as typically this is a general issue no matter how the DTC are designed internally.

For example, the second digital-to-time converter module 104 may be configured to receive the second adapted input signal 112, which may be based on the second input signal 111 with the added noise. The second input signal 111 may be a digital signal which includes successive control bit sequences for controlling a variable temporal delay of the second digital-to-time converter module 104, for example. For example, each control bit sequence may provide (or carry) information to the second digital-to-time converter module 104 on a variable temporal delay desired in the provided second oscillator signal 105.

The added noise may change at least one bit of the control bit sequences of the second input signal 111 which includes information for setting a temporal delay. The at least one bit of the control bit sequences may be changed by a random or a pseudo-random number to add the noise, for example. Thus an initial (desired) variable temporal delay based on the second input signal 111 may be changed to an adapted (desired) variable temporal delay based on the second adapted input signal 112 comprising the added noise.

The first processing module 106 may be configured to perform scrambling or ciphering of noise added to the first input signal 107 to generate the first adapted input signal 103. Alternatively, optionally, or additionally, the first processing module 106 may include a noise shaping module for generating the noise to be added to the first input signal 107. For example, the first processing module 106 may include a noise shaping module 200 (e.g. which may include dithering) for generating the noise to be added to the first input signal 107.

The second processing module 109 may be configured to perform scrambling or ciphering of noise added to the second input signal 111 to generate the second adapted input signal 112. Alternatively, optionally, or additionally, the second processing module 109 may include a noise shaping module for generating the noise to be added to the second input signal 111. For example, the second processing module 109 may include a noise shaping module 200 for generating the noise to be added to the second input signal 111.

Ciphering and scrambling may be used to provide the de-correlation of the two bit streams. For example, scrambling (a non-linear operation) may flip some bits, while adding noise (a linear operation) may add some error, which may cause carry overflow, for example. Some parameters or least significant bits of the noise generator may be scrambled or ciphered to generate the two uncorrelated noise to be added to the first input signal 107 and the second input signal 111 respectively.

Optionally, it may be possible to scramble parts of the input signal i.e. some LSBs, to achieve a non-Gaussian distributed noise (in Amplitude) such as a boxcar distribution, for example.

The noise added to the first input signal and the noise added to the second input signal are not correlated, for example. For example, they may be uncorrelated or at least de-correlated. In other words, the noise added to the first input signal and the noise added to the second input signal may each be randomly generated independently from each other (e.g. they may be different from each other, but do not interact), or at least not be fully correlated. For example, the second processing module 109 may be configured to perform a different scrambling or ciphering of the second input signal 111 to generate the uncorrelated noise.

Alternatively, optionally or additionally, different noise shaping modules may be implemented in the first processing module 106 and the second processing module 109 to generate the uncorrelated noise.

Alternatively, optionally or additionally, identical noise shaping modules may be implemented in the first processing module 106 and the second processing module 109 to generate the uncorrelated noise.

For both apparatuses 100 and 150, the noise added to the first input signal 107 (and/or the second input signal 111) may change one or more least significant bits of the control bit sequences (e.g. each of the control bit sequences) of the first input signal 107 (and/or the second input signal 111), for example. The changes to the respective control bit sequences of the first input signal 107 and second input signal 111 may be uncorrelated. The added noise may have a typical magnitude of one or more least significant bits of the respective control bit sequences.

The least significant bits may be provided to control a fine temporal delay module of the first digital-to-time converter module 101. In other words, the added noise may change at least one bit of the control bit sequences of the first input signal 107 (and/or the second input signal 111) which includes information for setting a fine temporal delay. The one or more least significant bits of the control bit sequences may be changed by a random number or a pseudo-random number to add the noise, for example. Thus an initial fine temporal delay value based on the first input signal 107 may be changed to an adapted fine temporal delay value based on the first adapted input signal 103 due to the noise added to the first input signal 107. Similarly, an initial fine temporal delay value based on the second input signal 111 may be changed to an adapted fine temporal delay value based on the second adapted input signal 112 due to the noise added to the second input signal 111.

The control bit sequence of the first input signal 107 may also include bits (e.g. most significant bits) for controlling a coarse temporal delay module of the first digital-to-time converter module 101 and bits (e.g. least significant bits) for controlling a fine temporal delay module of the first digital-to-time converter module 101. Similarly, the control bit sequence of the second input signal 111 may include bits (e.g. most significant bits) for controlling a coarse temporal delay module of the second digital-to-time converter module 102 and bits (e.g. least significant bits) for controlling a fine temporal delay module of the second digital-to-time converter module 102, for example.

Additionally, optionally or alternatively, the added noise may lead to a deviation, change or error of one or more most significant bits of the control bit sequences. The most significant bits may be provided to control the coarse temporal delay module of the first digital-to-time converter module 101, for example. The one or more most significant bits of the control bit sequences may be changed by a random number or a pseudo-random number to add the noise, for example.

Optionally or alternatively, the added noise may leave unchanged one or more most significant bits of the control bit sequences (e.g. excluding occasional carry effects), wherein the most significant bits include information to control the coarse temporal delay module, for example. For example, only a (fine) temporal delay of only the fine temporal delay modules of the first digital-to-time converter module 101 and the second digital-to-time converter module 104 may be change by the added noise. Control information for the coarse temporal delay module may remain unchanged by the added noise, for example. However due to occasional carry effects (e.g. adding a single LSB may lead to a carry effect which may affect the most significant bit, in decimal notation this corresponds to 1999+1=2000, in binary notation 1111b+1b=10000b), the control information for the coarse temporal delay module may be changed at least sometimes. The added noise may be smaller in magnitude than the most significant bits, for example.

Figure 2:
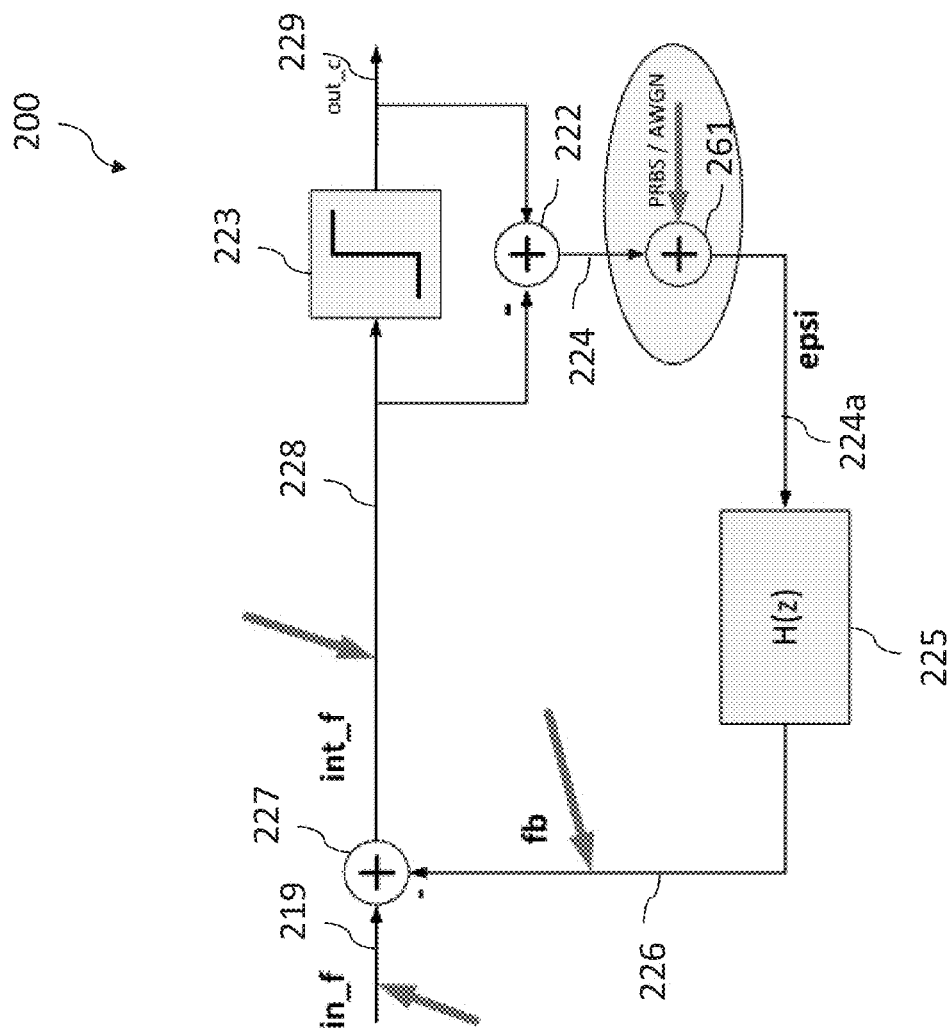
FIG. 2 shows a schematic illustration of a noise shaping module.

FIG. 2 shows a noise shaping module 200 according to an example.

The noise shaping module 200 may include a quantization module 223. The noise shaping module 200 may be configured to receive an input signal 219 (e.g. the first input signal 107 or the second input signal 111). The input signal 219 may be provided to the quantization module 223 and a first signal adder 222. The quantization module 222 may generate a quantization error based on a difference between the input signal 219 and an output signal 229 (e.g. the first adapted input signal 103 or the second adapted input signal 112).

The output signal 229 may be provided at an output interface of the noise shaping module 200 and/or be received by the first signal adder 222. The first signal adder 222 may calculate a difference between the output signal 229 and the input signal 219, which corresponds to an effective error. The effective error comprises a quantization error and a remaining mismatch error and provides an error signal 224 to a feedback filter 225 for noise shaping.

The feedback filter 225 for noise shaping may perform an operation H(z) to provide a noise-shaped feedback signal 226 to a second signal adder 227. The second signal adder 227 may be configured to calculate a sum and/or difference of input signal 219 and feedback signal 226 and to provide a modified input signal 228 to quantization module 223 and the first signal adder 222 in a second and subsequent iteration steps. Quantization module 223 may generate a quantization error to provide output signal 229. In the next iteration, the first signal adder 222 provides the now recalculated error signal 224 to the feedback filter 225 for noise shaping. The feedback filter 225 for noise shaping may be configured to mitigate error contributions within the spectrum caused by quantization in time domain.

The noise shaping module 200 may further include an error generator configured to perform dithering. Dithering may be performed by adding an error contribution (e.g. a dithering signal according to a dithering algorithm) to the error signal 224 with a third signal adder 261. The dithering signal may be a signal with a distribution like a pseudo-random binary sequence (PRBS) or an additive white Gaussian noise (AWGN). The dithering may be applied to error signal 224 resulting in an altered error signal 224a (epsi). Alternatively, dithering may be applied at feedback signal 226 (fb), input signal 219 (in_f) or modified input signal 228 (int_f) as marked by arrows. At one of these points noise (e.g. AWGN or other kind of noise) may be injected and shaped to the desired spectrum via the feedback filter H(z).

To boost the smearing effect of the noise shaping module, it may be possible to increase the order of the noise shaper, or to try to increase the error contribution inside the noise shaper. An implementation of dithering may give rise to increasing noise-floors with minor influence on the smearing of the spurs.

The first processing module 106 of apparatuses 100, 150 may include a first noise shaping module. The second processing module 109 (of apparatus 150) may include a second noise shaping module. The first noise shaping module (and the second noise shaping module) may be identical noise shaping modules, which are similar or identical to the noise shaping module 200.

The first noise shaping module and the second noise shaping module may be configured to generate the uncorrelated noise in the first adapted input signal 103 and the second adapted input signal 112.

For example, the first noise shaping module may be configured to generate noise based on a first noise sequence (e.g. based on a first dithering signal generated according to a first dithering sequence or algorithm). The second noise shaping module may be configured to generate (uncorrelated) noise based on a second noise sequence (e.g. based on a second different dithering signal generated according to a second dithering sequence or algorithm different). In other words, the first noise shaping module may be configured to generate noise based on a first dithering algorithm. The second noise shaping module may be configured to generate noise based on a second dithering algorithm, for example. The first dithering algorithm and the second dithering algorithm may be different.

The first noise sequence and the second noise sequence may represent different additive white Gaussian noise (AWGN) or pseudo random binary sequences (PRBS). The first noise sequence and the second noise sequence may be generated by the error generator, for example.

Additionally, alternatively or optionally, the first noise shaping module and the second noise shaping module may be configured to generate noise based on different look-up tables or different values in a look-up table. For example, different loop-up tables or different values in a look-up table may lead to different (or uncorrelated) noise sequences being generated by the first noise shaping module and the second noise shaping module.

Additionally, alternatively or optionally, the first noise shaping module and the second noise shaping module may be configured to generate noise based on different seed values or different cycle lengths.

Additionally, alternatively or optionally, the first noise shaping module and the second noise shaping module may each include different feedback filters to generate the uncorrelated noise. For example, the first noise shaping module (and the second noise shaping module) may each include a feedback loop. For example, the first dithering signal (PRBS and/or AWGN) and the second dithering signal (PRBS and/or AWGN) may be added at different positions within the first noise shaping module and the second noise shaping module respectively (e.g. at different positions of the feedback loop). For example, the first dithering signal may be applied at feedback signal 226 (fb) of the first noise shaping module and the second dithering signal may be applied at input signal 219 (in_f) of the second noise shaping module.

Dithering may also be implemented for other reasons e.g. to combat discretization or nonlinearities, and shared dithering modules may be used to generate the uncorrelated dithering for the two digital-to-time converter modules, for example. Due to the noise added to the input signals of the two digital-to-time converter modules being uncorrelated, any regularity between digital-to-time converter modules may be broken up or reduced independent of which signals the two digital-to-time converter modules process, for example. Consequently, coincidences between the two digital-to-time converter modules may also be randomly distributed, instead of occurring periodically, for example. Such randomly occurring disturbances may then not create any spurs (or reduce spurs).

More details and aspects are mentioned in connection with the examples described above or below. The examples shown in FIG. 2 may comprise one or more optional additional features corresponding to one or more aspects mentioned in connection with the proposed concept or one or more examples described above (e.g. FIG. 1) or below (e.g. FIGS. 3 to 7).

Figure 3A:
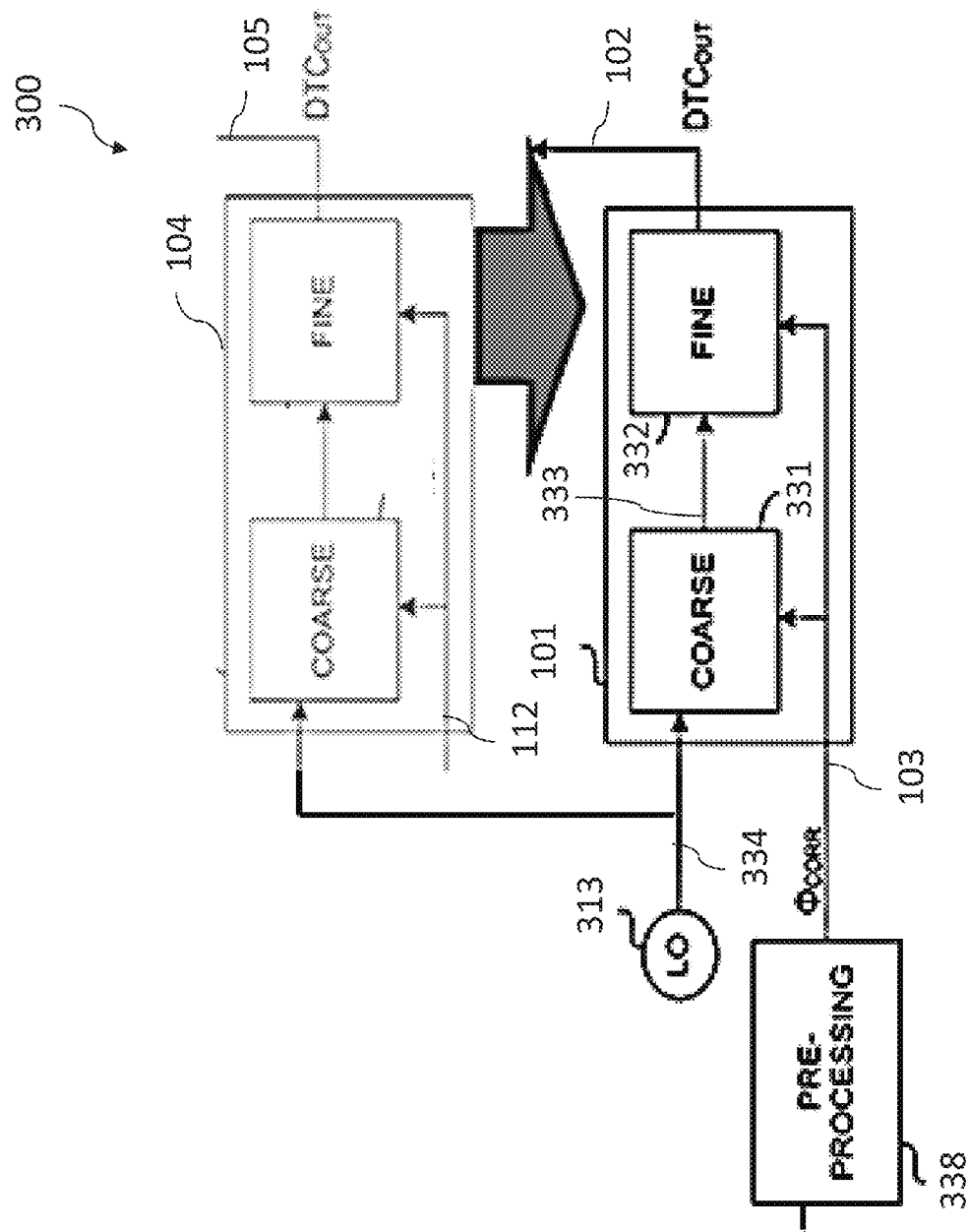
FIG. 3A shows a schematic illustration of a digital-to-time converter module of a further apparatus for providing oscillator signals which includes a coarse temporal delay module and a fine temporal delay module.

FIG. 3A shows an example of an apparatus 300 for providing oscillator signals having a coarse temporal delay module and a fine temporal delay module according to an example. The apparatus 300 may additionally or optionally include one or more or all of the features of the apparatus already described with respect to FIGS. 1 and 2.

The first digital-to-time converter module 101 (which may be similar to the first digital-to-time converter module 101 of FIG. 1) may include a coarse temporal delay module 331 configured to generate at least one coarse delay oscillator signal 333 associated with a coarse oscillator frequency.

The first digital-to-time converter module 101 may further include a fine temporal delay module 332 configured to generate the first oscillator signal 102 having a variable temporal delay based on the at least one coarse delay oscillator signal 333 and a fine temporal delay.

The coarse temporal delay module 331 may be configured to provide or generate the course oscillator signal 333 based on the reference oscillator signal 334. For example, a period of the coarse oscillator signal 333 generated by the course temporal delay module 331 may be equal to the period of the reference oscillator signal 334 or longer only (e.g. not shorter than the period of the reference oscillator signal 334), for example. Additionally or optionally, the coarse oscillator frequency may be a sub-harmonic of a frequency of the reference oscillator signal 334, for example.

The fine temporal delay module 332 may include a plurality of inverter circuits or a digitally controlled edge interpolator (DCEI), for example. For example, the fine temporal delay module 332 may be controlled by the adapted input signal 103 to provide the first oscillator signal 102 adjusted by a fine temporal delay. For example, the fine temporal delay may be smaller than a minimal or maximal period of the coarse delay oscillator signal 333 providable by the course temporal delay module 331. For example, the fine temporal delay module 332 may be configured to generate a fine temporal delay smaller than a period of the reference oscillator signal 334. For example, the fine temporal delay may be between zero and a period of the reference oscillator signal 334.

Additionally, optionally or alternatively, a period of the coarse delay oscillator signal 333 generated by the coarse temporal delay module 331 may have (or comprise) a coarse temporal delay based on the added noise changing at least one bit (e.g. one or more most significant bits) of a control bit sequence of the first input signal.

For example, a period of the (adapted) coarse delay oscillator signal comprising the coarse temporal delay (e.g. generated based on the adapted input signal comprising one or more most significant bits changed based on the added noise) may be larger than a period of the coarse delay oscillator signal without the coarse temporal delay. (e.g. generated based on an adapted input signal comprising one or more unchanged most significant bits). For example, the coarse temporal delay may increase the period of the (adapted) coarse delay oscillator signal by an integer multiple of a period of a coarse delay oscillator signal that would have been generated based on an adapted input signal comprising one or more unchanged most significant bits. For example, the integer may be greater than or equal to 2.

Additionally, optionally or alternatively, the first digital-to-time converter module 101 may include one or more medium temporal delay modules which may be configured to generate one or more medium delay oscillator signals based on the reference oscillator signal 334. For example, the first digital-to-time converter module 101 may be a multi-stage digital-to-time converter. A period of the medium delay oscillator signal may include a medium temporal delay. For example, the medium temporal delay may increase the period of the (adapted) coarse delay oscillator signal by less than one period of a coarse delay oscillator signal that would have been generated based on an adapted input signal comprising one or more unchanged most significant bits. For example, the medium temporal delay may be greater than the fine temporal delay and/or larger than a period of the reference oscillator signal 334.

For example, the one or more medium temporal delay modules may be connected to the coarse temporal delay module 331 or may be part of the coarse temporal delay module 331, and controlled by one or more most significant bits of the control bit sequences, for example. This may have a better resolution that corresponds to the input oscillation from the local oscillator. Optionally or alternatively, the one or more medium temporal delay modules may be connected to the fine temporal delay module 332 or may be part of the fine temporal delay module 332, and controlled by one or more least significant bits of the control bit sequences, for example. Optionally or alternatively, the one or more medium temporal delay modules may be connected between the coarse temporal delay module 331 and the fine temporal delay module 332, for example.

The first digital-to-time converter module 101 may be configured to provide the first oscillator signal 102 including a variable temporal delay based on only the fine temporal delay provided by the fine temporal delay module, for example. Additionally, optionally or alternatively, the first digital-to-time converter module 101 may be configured to provide the first oscillator signal 102 including a variable temporal delay based on the fine temporal delay and a medium temporal delay provided by the medium temporal delay module only, for example. Additionally, optionally or alternatively, the first digital-to-time converter module 101 may be configured to provide the first oscillator signal 102 including a variable temporal delay based on the fine temporal delay, the medium temporal delay and a coarse temporal delay provided by the coarse temporal delay module 331, for example. (For example, it may be possible for a coarse stage that runs on a lower frequency, followed by a fine or medium stage running at higher frequency).

By shifting (or delaying) the first oscillator signal 102 by an entire step (e.g. by a coarse or medium step), overlap of the drain in the supply voltage (VCC) may be avoided, and degradation of performance may be avoided.

The preprocessing block 338 may be configured to generate the desired delay to be incurred (or incorporated) in the LO signal to produce the first oscillator signal 102. The desired delay may be generated based on an input signal format which may not contain this delay information directly but may contain e.g. a phase information or any information characterizing the desired modulation in any format. The delay of the coarse temporal delay module 331 may be parametrized by the most significant bits of the adapted input signal 103, generated by the preprocessing block 338 while the delay of the fine temporal delay module 332 may be parametrized by the least significant bits of the adapted input signal 103 preprocessing block 338. The preprocessing block 338 may thus generate specific input signals 103 for the coarse temporal delay module 331 and the fine temporal delay module 332. However, there may not be a preset split according to bits of the adapted input signal 103 i.e. some of the bits may affect both the coarse temporal delay module 331 and the fine temporal delay module 332, but typically the most respectively least significant bits will predominately affect the coarse respectively fine temporal delay module 331 respectively 332.

While each DTC has several digital stages, the fine stage works in analogue, e.g. by interpolating between two flanks at given times. Fine tuning may be achieved by selecting stronger or weaker drivers triggered by the two adjacent "digital" flanks. This concept may be referred to as digitally controlled edge interpolation (DCEI). Different driver strengths may be selected by activating a different number of elementary drivers, for example.

Driver strength may also depend on supply voltage (VCC). When triggered these drivers may also draw current from VCC and may cause VCC ripple. If two (or more) digital-to-time converter modules operate simultaneously, they may interfere with each other as they both cause ripples at VCC and in turn suffer from the ripples generated by the other DTC. Using multiple digital-to-time converter modules may however be required for multi-band, carrier aggregation, multi-standard, and multi-mode devices having multiple radio frequency (RF) parts that may be implemented using multiple digital-to-time converter modules.

The coarse stage (coarse temporal delay module 331) may select two flanks (edges) of a frequency source (e.g. of the reference oscillator signal 334) at an approximately desired timing. These selected flanks (edges) are shown at time instances 1 and 2 in FIG. 3B. The coarse temporal delay module 331 may be configured to select the two flanks based on control information provided in the one or more most significant bits of the control bit sequences. For example, the coarse temporal delay module 331 may be configured to select edges of the reference oscillator signal 334 such that an output oscillator signal 333 may have a period equal to or longer than the period of the reference oscillator signal 334. Additionally or optionally, the coarse temporal delay module 331 may be configured to select edges of the reference oscillator signal 334 such that the output oscillator signal 333 may have a period having a coarse oscillator delay or a period having a medium oscillator delay based on added noise changing the most significant bits of the adapted input signal.

The coarse temporal delay module 331 may connect these two flanks (edges) with two sets of inverters 335 and 336 of the fine temporal delay module 332 (shown in FIG. 3B below). For example, the coarse temporal delay module 331 may provide a (first) coarse delay oscillator signal associated with the first edge to the first set of inverters 335, and a (second) coarse delay oscillator signal associated with the second edge to the second set of inverters 336. The period of the at least one coarse oscillator signal may be the time between the (first) edge of the (first) coarse delay oscillator signal and the (second) edge of the (second) coarse delay oscillator signal.

One or more additional dithering processes (e.g. similar to the dithering process described with respect to FIG. 2) may be used to generate the added noise for introducing the coarse temporal delay (e.g. at least one step of the coarse stage) or the medium temporal delay, in addition to fine tuning by the fine temporal delay module (e.g. there is a shift of more than the tuning range of the fine stage, for example).

Figure 3B:
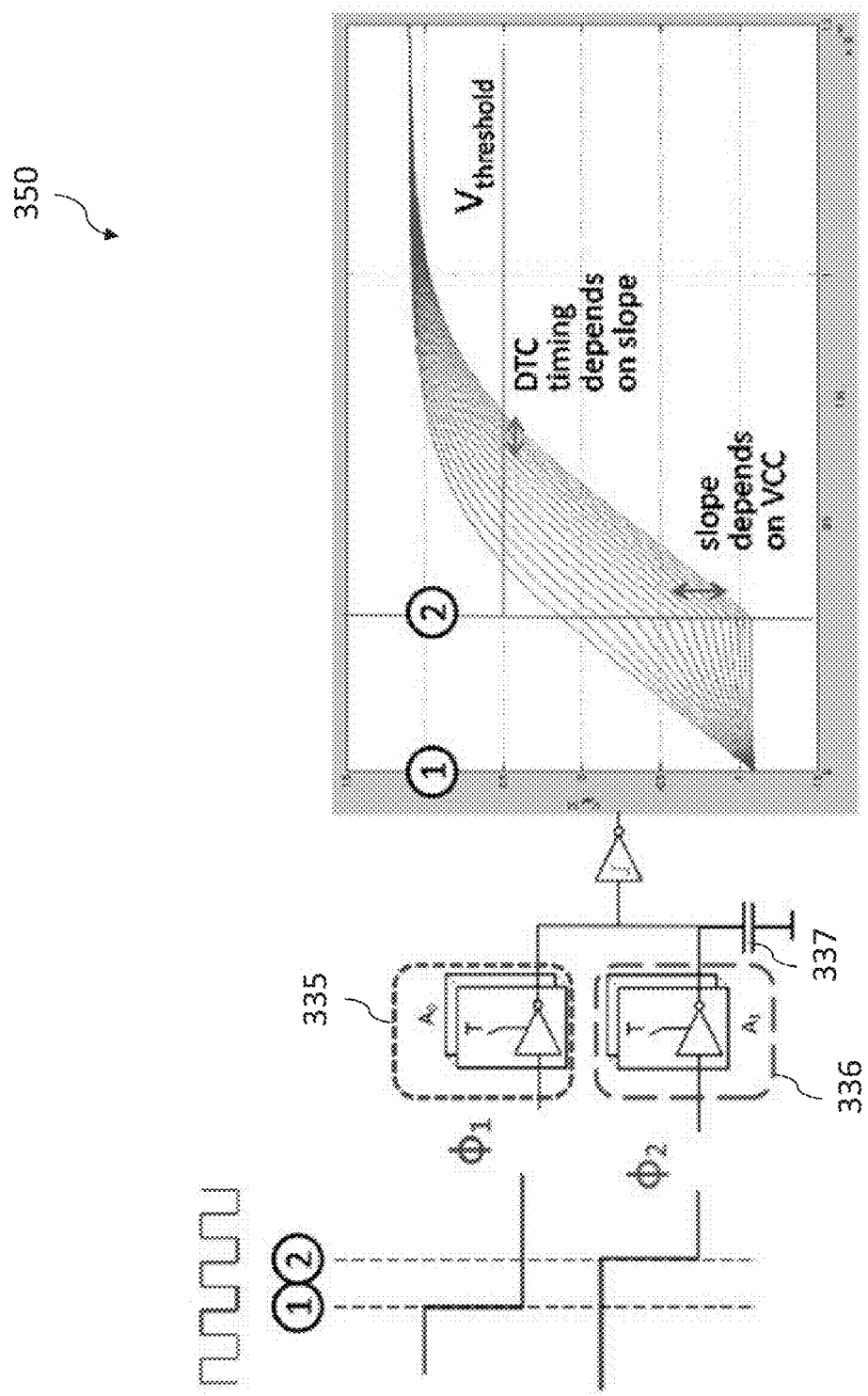
FIG. 3B shows a schematic illustration of the operation of a fine temporal delay module.

FIG. 3B shows a schematic illustration of an implementation of the operation of a fine temporal delay module. In the fine stage (e.g. fine temporal delay module 332) a selected number of "top" inverters in 335 may be switched at a first time instance (1) and another selected number of inverters in 336 may be switched at a second time instance (2). The slope of the output voltage, measured at the capacitor 337 may depend on the number of active inverters (which act as current sources). In this way the output timing e.g. the fine temporal delay when the voltage reaches Vthreshold of the subsequent trigger may be selected by selecting the proper numbers of inverters in 335 and 336.

Since the slope does not only depend on the number of inverters (shown in the array of curves for different numbers), but also on the voltage they are operated with, this voltage may be impacted if another DTC happens to be switching at the same time because the same flanks have been selected in that digital-to-time converter module's coarse stage. The other DTC may cause a load on VCC which may also reduce the supply voltage for the first DTC and impact its operation. This may also delay the DTC output. If such delays happen regularly, e.g. due to a regular beating (or matching) of the frequencies generated by the two digital-to-time converter modules, this regular timing error may cause spurs in the output spectrum, for example.

By adding uncorrelated noise to the first input signal 107 and the second input signal 111, dithering may be used to avoid spurs due to non-idealities of the circuitry by deliberately making larger deviations from an ideal signal than necessary. By feeding back the error in a feedback loop to get the correct result in average spurs may be avoided because the regularities are broken up as well, for example. Strictly repetitive errors may be avoided in this way (replaced by larger, non-repetitive deviations), thus eliminating spurs at the expense of a somewhat higher noise floor, for example. However, the error may be apparent at neither of the digital-to-time converter modules and therefore cannot be tackled there.

The various examples described herein may apply to a fine temporal delay module (implementing DCEI) and other DTC implementations apart from those in which a fine stage selects one of a set of flanks of a given oscillator. Without a fine temporal delay module the resolution would be limited to the generated set of flanks (in the coarse stage). Instead of a DCEI, a line of inverters with adjustable delay may be used (e.g. by adjusting the number of inverters, the inverters supply voltage or adjusting the load experienced by the inverters). The available supply voltage also impacts the effective delay in these cases, for example. The examples may relate to a DCEI and a line of inverters being used as delay module. Optionally or alternatively, other adjustable delay means may be used.

Instead of using two temporal delay modules, three or more temporal delay modules (e.g. a course temporal delay module, followed by a medium temporal delay module followed by a fine temporal delay module) may be used. For example, the coarse temporal delay module may set the delay with a resolution of the reference oscillator signal 334. The coarse (or medium) temporal delay module may set the delay with a resolution of the reference oscillator signal 334 divided by a small number (e.g. a quarter), and the fine temporal delay module may set the delay with a resolution of the reference oscillator signal 334 divided by a larger number (e.g. a sixteenth). The medium and fine temporal delay modules may use different implementations (e.g. the medium temporal delay module may use a line of inverters while the fine temporal delay module may use a DCEI), for example.

According to an example, the added noise may be of the order of the resolution of the medium temporal delay module but does not affect the coarse temporal delay module (apart from possible carry effects as explained above). Thus least significant bits may affect the fine temporal delay module and most significant bits the medium temporal delay module and the coarse temporal delay module. Consequently most significant bits may already correspond to a resolution that is below the period of the reference oscillator signal 334.

Additionally, alternatively or optionally, the medium temporal delay modules of different digital-to-time converter modules (e.g. the first digital-to-time converter module 101 and the second digital-to-time converter module 104) may use different implementations, thus also de-correlating the time grid as seen by the subsequent find temporal delay modules and thus mitigating the effect of inter-dependences due to VCC ripples. For example, if a medium temporal delay modules comprises a selectable number of inverters arranged in series, the different modules may utilize different numbers of inverters with different elementary delays to achieve the same overall delay span but with (at least slightly) different resolution. This greatly reduces the chances that the two subsequent temporal delay modules area active at exactly the same time, for example.

Additionally, alternatively or optionally, the span of the delay of the fine temporal delay module may be larger than the resolution of the coarse temporal delay module (or the medium temporal delay module in case of using more than two temporal delay modules within a digital-to-time converter module 101). Then part of the added noise or randomness that affects the setting of the coarse temporal delay module may be compensated by the fine temporal delay module. For example, if the delay of the coarse temporal delay module is reduced by on resolution step of the coarse temporal delay module compared to the ideal setting, the delay of the fine temporal delay module may be increased by a similar amount without exceeding the range of the fine temporal delay module. In this way no error or only a small error is introduced in the final output signal. Nonetheless, a de-correlation compared to the timing in a second time converter module 101 may be achieved, for example.

More details and aspects are mentioned in connection with the examples described above or below. The examples shown in FIG. 3 may comprise one or more optional additional features corresponding to one or more aspects mentioned in connection with the proposed concept or one or more examples described above (e.g. FIGS. 1 and 2) or below (e.g. FIGS. 4 to 7).

Figure 4:
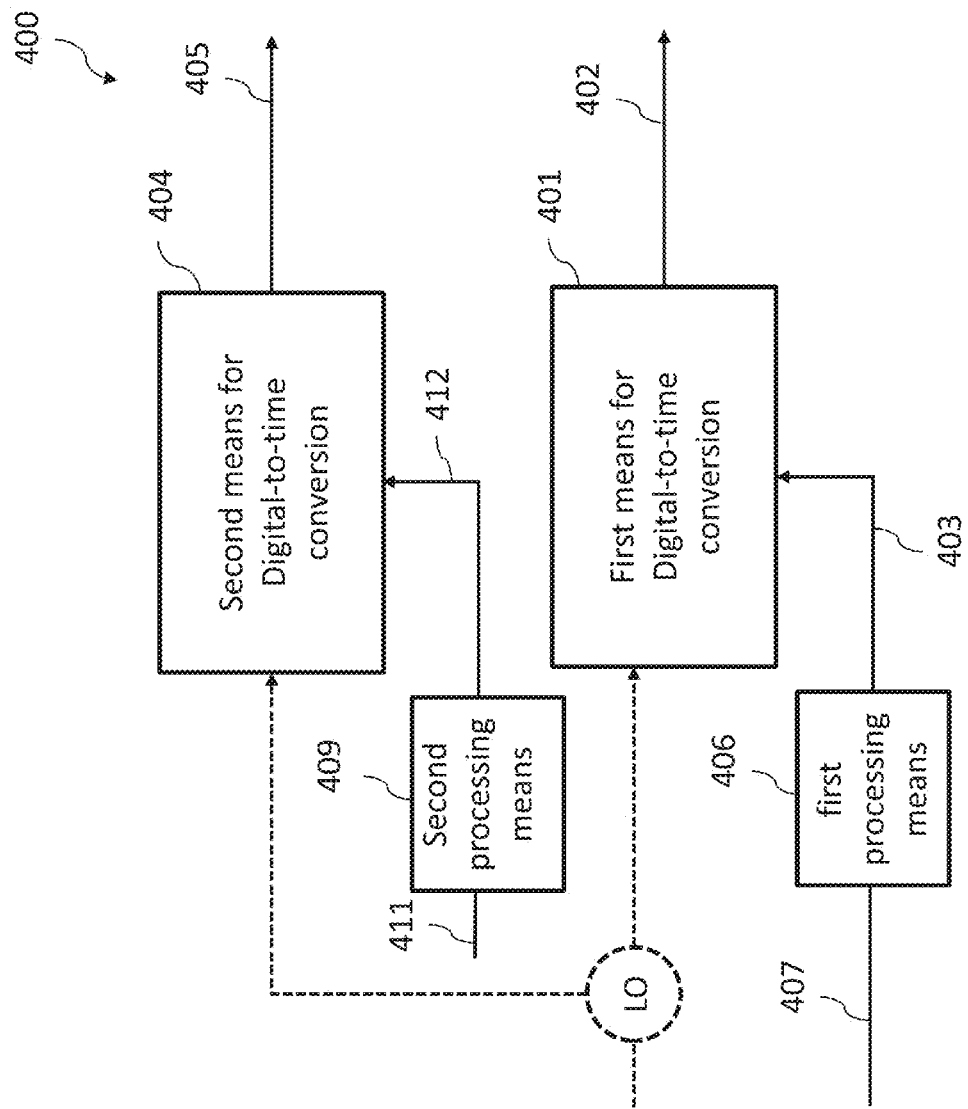
FIG. 4 shows a schematic illustration of a means for providing oscillator signals.

FIG. 4 shows an apparatus 400 for providing oscillator signals according to an example.

The apparatus 400 for providing oscillator signals includes a first means for digital-to-time conversion 401 configured to generate a first oscillator signal 402 based on a first adapted input signal 403. The apparatus 400 for providing oscillator signals further includes a second means for digital-to-time conversion 404 configured to generate a second oscillator signal 405. The apparatus 400 for providing oscillator signals further includes a first processing means for generating adapted input signals 406 configured to generate the first adapted input signal 403 of the first means for digital-to-time conversion 401 by adding noise to a first input signal 407.

Due to the apparatus 400 for providing oscillator signals adding noise to the first input signal 407 to generate the first adapted input signal 403, a reduction in spurs and oscillator signals with more accurate time delay may be produced by the two digital-to-time converter modules. Adding noise to the first input signal may lead to a temporal (i.e. time) variation or temporal deviation of processes (e.g. delay processes) carried out by the first means for digital-to-time conversion 401, which may avoid or reduce coincidences between signal provided by the first means for digital-to-time conversion 401 and the second means for digital-to-time conversion 404. This may lead to interference between the first means for digital-to-time conversion 401 and the second means for digital-to-time conversion 404 being reduced or minimized, for example.

For example, the first input signal 407 may be a digital signal including successive control bit sequences for controlling a variable temporal delay of the first means for digital-to-time conversion 401.

For example, one or more least significant bits of the control bit sequences may be changed by a random number or a pseudo-random number to add the noise.

For example, the first means for digital-to-time conversion 401 may be configured to generate the first oscillator signal 402 and the second means for digital-to-time conversion 404 may be configured to generate the second oscillator signal 405 based on a same reference oscillator signal.

For example, a second processing means for generating adapted input signals 409 may be configured to generate a second adapted input signal 412 by adding noise to a second input signal 411. The second means for digital-to-time conversion 404 may be configured to provide the second oscillator signal 405 based on the second adapted input signal 412.

For example, the noise added to the first input signal and the noise added to the second input signal may be uncorrelated.

More details and aspects are mentioned in connection with the examples described above or below. The examples shown in FIG. 4 may comprise one or more optional additional features corresponding to one or more aspects mentioned in connection with the proposed concept or one or more examples described above (e.g. FIGS. 1 to 3) or below (e.g. FIGS. 5 to 7).

Figure 5:
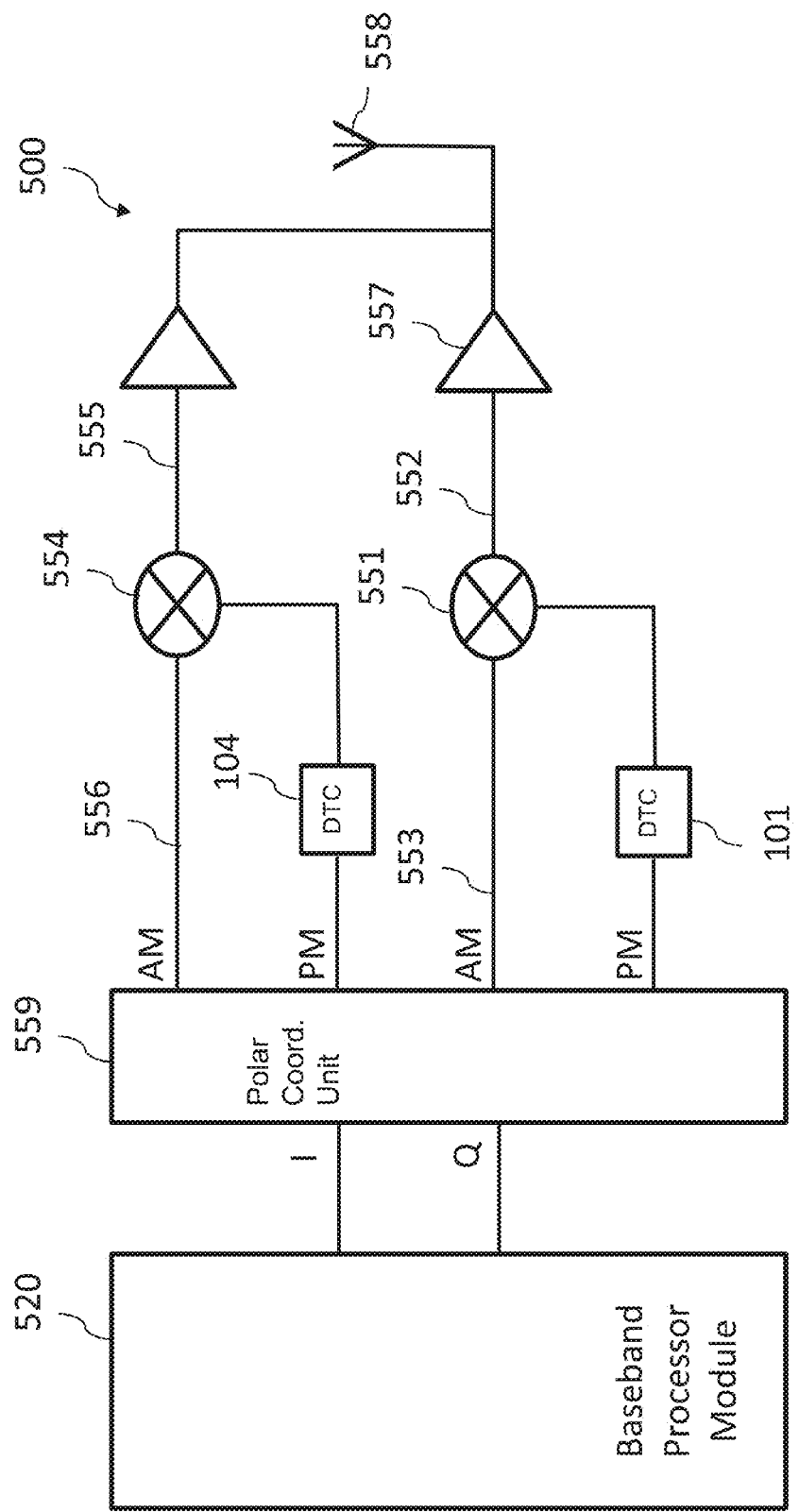
FIG. 5 shows a schematic illustration of a transmitter module.

FIG. 5 shows a transmitter 500 according to an example. The transmitter 500 includes a first mixer module 551 configured to generate a first radio frequency transmit signal 552 by mixing a first amplitude signal 553 with a first oscillator signal 102.

The transmitter 500 includes a second mixer module 554 configured to generate a second radio frequency transmit signal 555 by mixing a second amplitude signal 556 with a second oscillator signal 105. The transmitter 500 includes an apparatus for providing oscillator signals configured to generate the first oscillator signal 102 and the second oscillator signal 103.

The apparatus may include one or more or all of the features already described with respect to the apparatuses for providing oscillator signals according to previous figures. For example, the apparatus may include the first digital-to-time converter module 101 and the second digital-to-time converter module 104.

The transmitter 500 may further include a baseband processor module 520 for generating at least the digital (e.g. baseband) signal to be transmitted and/or processing a baseband signal. Digitized in-phase (I) and quadrature (Q) signals may be provided based on the baseband signal, for example.

The transmitter 500 may be a polar transmitter, for example. The transmitter 500 may further include a polar coordinate provider 559 which may be configured to receive signals in a digital IQ (I: in phase, Q: quadrature) representation from the baseband processor module 520, and to translate the signal from the IQ representation into polar coordinates, wherein the amplitude or the magnitude is described by the digital amplitude signal AM, and the phase is described by the phase signal PM provided by the polar coordinate provider 559 (which corresponds to the digital signal).

The transmitter 500 may also have a power amplifier 557 connected to an output of each mixer module 551, 554 via a suitable, optional transmission path (e.g. having an amplifier and a matching network) in order to transmit the amplitude and phase-modulated transmission signal 552, 555 to the antenna.

Further examples may also relate to a transmitter, a receiver or a transceiver including the apparatus described above. Additionally, optionally or alternatively, the transmitter 500 may be part of a radio frequency (RF) transceiver. Although a transmitter (e.g. a polar transmitter) has been described, additionally, optionally or alternatively, the first digital-to-time converter module 101 and the second digital-to-time converter module 104 of the apparatus may be used to generate the I- and Q-signals in an IQ-transmitter or the required I- and Q-signals in a receiver and/or a radio frequency RF transceiver, for example.

The components of the transceiver 500 (e.g. the baseband processor module 520, the polar coordinate provider, the apparatus (100, 150, 300, 400), the first mixer module 551, the second mixer module 554 may be formed on the same semiconductor chip, for example. The chip may include chip circuitry for RF generation (e.g. for cellular transmission like GSM, UMTS, LTE or others, or for connectivity like WiFi or Bluetooth).

More details and aspects are mentioned in connection with the examples described above or below. The examples shown in FIG. 5 may comprise one or more optional additional features corresponding to one or more aspects mentioned in connection with the proposed concept or one or more examples described above (e.g. FIGS. 1 to 4) or below (e.g. FIGS. 6 to 7).

Figure 6:
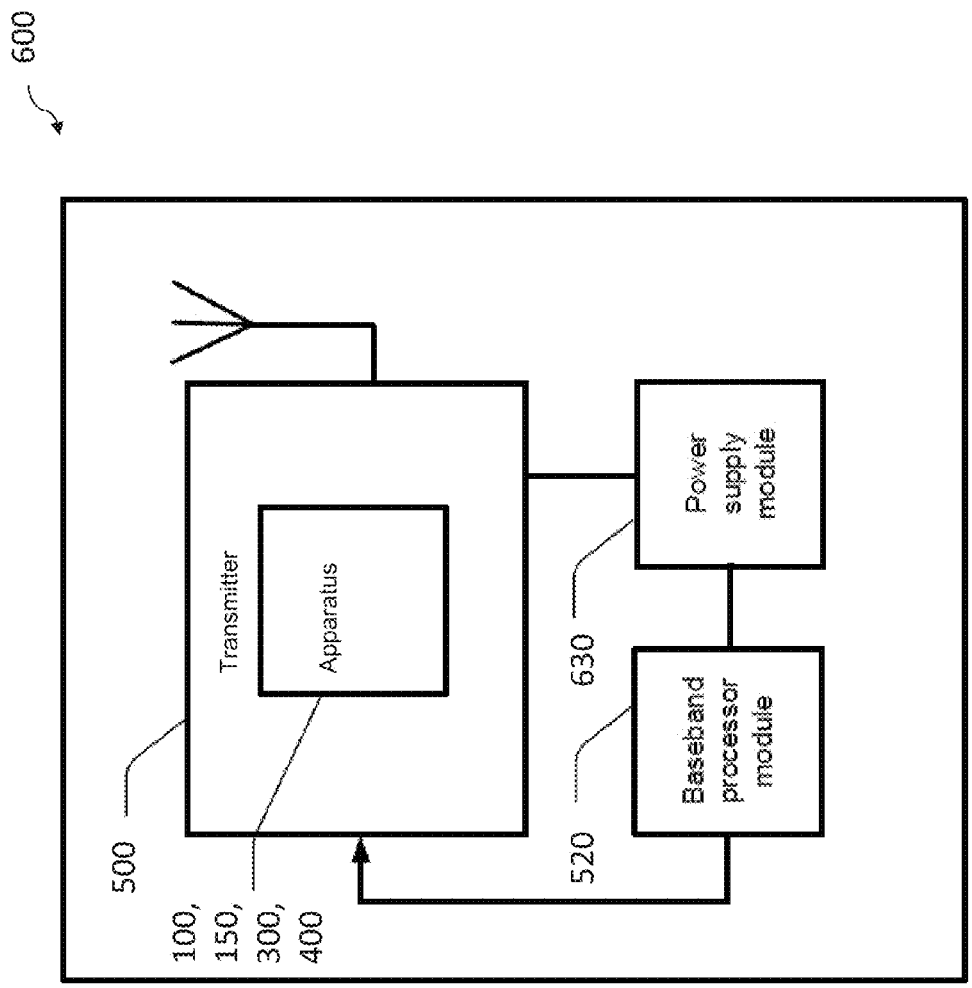
FIG. 6 shows a block diagram of a mobile device comprising a transmitter module.

FIG. 6 shows a schematic illustration of a mobile device 600. The mobile device comprises an apparatus for providing oscillator signals (e.g. 100, 150, 200, 300) or means for providing oscillator signals (e.g. 400) described in FIGS. 1 to 5, which is implemented in or within a transmitter (e.g. 500). Further, the mobile device 600 comprises a baseband processor module 520 for generating at least the digital (e.g. baseband) signal to be transmitted and/or processing a baseband signal. Additionally, the mobile device 600 comprises a power supply unit 630 supplying at least the transmitter 500 and the baseband processor module 520 with power.

In some examples, the power supply unit 630 may be integrated or implemented as at least part of the variable power supply module described in previous examples.

Further examples relate to a mobile device (e.g. a cell phone, a tablet or a laptop) including a transmitter, a receiver or a transceiver including the apparatus described above. The mobile device or mobile terminal may be used for communicating in a mobile communication system. In some examples, a cell phone may include a transmitter or a transceiver comprising digital to analog converter circuit according to the proposed concept or one or more examples described above.

More details and aspects are mentioned in connection with the examples described above or below. The examples shown in FIG. 6 may comprise one or more optional additional features corresponding to one or more aspects mentioned in connection with the proposed concept or one or more examples described above (e.g. FIGS. 1 to 5) or below (e.g. FIG. 7).

Figure 7:
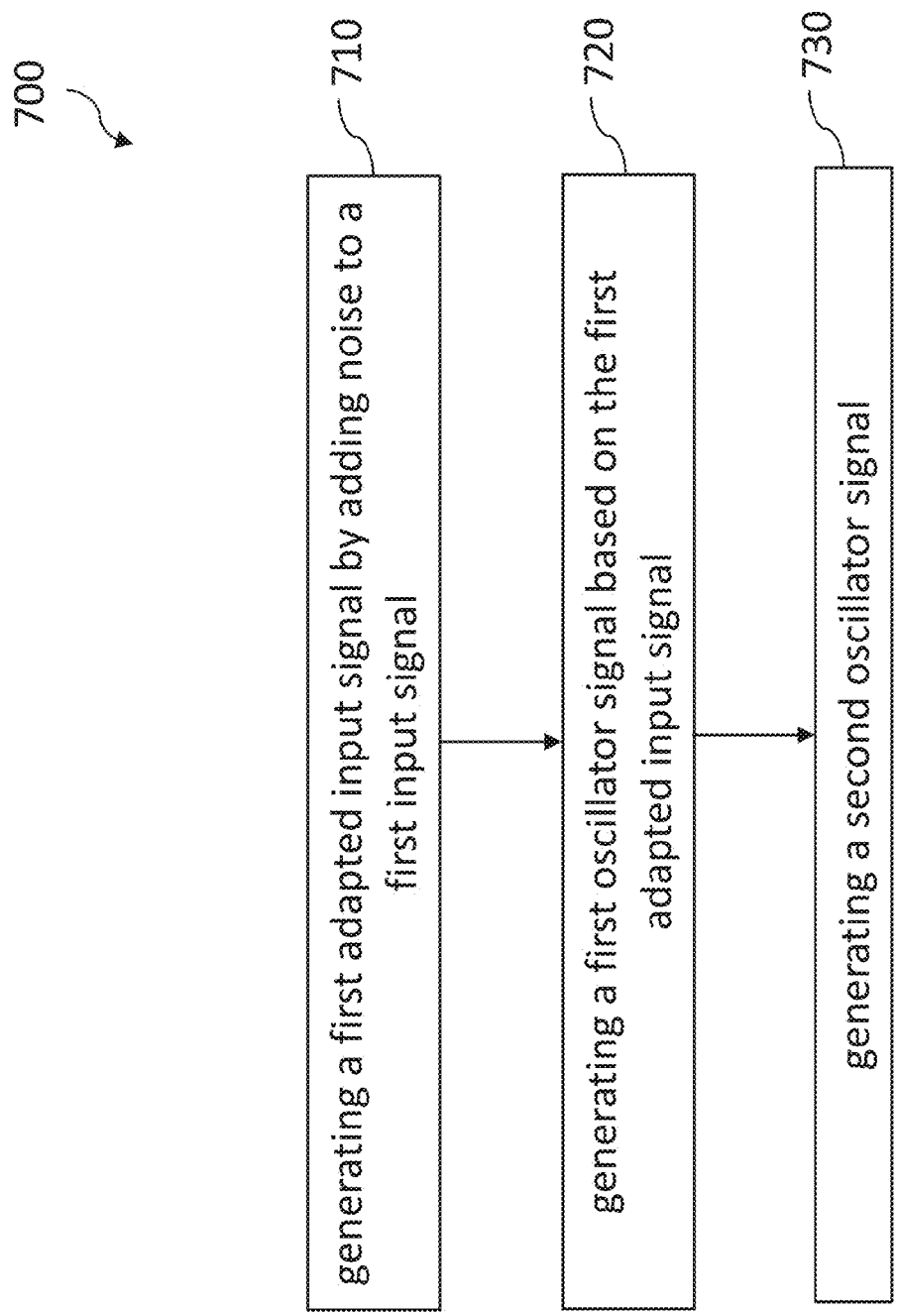
FIG. 7 shows a flowchart of a method for providing oscillator signals.

FIG. 7 shows a method 700 for providing oscillator signals, according to an example.

The method 700 includes generating (710) by a first processing module a first adapted input signal by adding noise to a first input signal.

The method 700 includes generating (720) by a first digital-to-time converter module a first oscillator signal based on the first adapted input signal.

The method 700 includes generating (730) by a second digital-to-time converter module a second oscillator signal.

Due to the adding of noise to a first input signal to generate the first adapted input signal, a reduction in spurs and oscillator signals with more accurate time delay may be produced by the two digital-to-time converter modules.

The method 700 may further include adding noise to change at least one bit of the control bit sequences of the first input signal including information for setting a fine temporal delay.

The method 700 may further include changing one or more least significant bits of control bit sequences of the input signal by a random number or a pseudo-random number to add the noise.

The method 700 may further include generating the first oscillator signal and the second oscillator signal based on a same reference oscillator signal.

The method 700 may further include generating by a second processing module a second adapted input signal by adding noise to a second input signal. The method 700 may further include providing by the second digital-to-time converter module the second oscillator signal based on the second adapted input may be uncorrelated.

More details and aspects are mentioned in connection with the examples described above or below. The examples shown in FIG. 7 may comprise one or more optional additional features corresponding to one or more aspects mentioned in connection with the proposed concept or one or more examples described above (e.g. FIGS. 1 to 6) or below.

Various examples relate to a machine readable storage medium including program code, when executed, to cause a machine to perform the method 700.

Various examples relate to a machine readable storage including machine readable instructions, when executed, to implement the method 700 or realize an apparatus 100, 150 300, 400.

Various examples relate to a computer program having a program code for performing the method of 700 when the computer is executed on a computer or processor.

There is a demand for providing a concept for generating oscillator signals which suffer from reduced or minimal interference between two neighboring digital-to-time converter modules. This demand may be satisfied by the examples described herein above and below.

Various examples relate to avoiding interference between two digital-to-time converter modules due to VCC ripples by independent dithering. Various examples relate to avoiding interference between two digital-to-time converter modules due to VCC ripples by independent dithering. Various examples relate to combining two dithering stages, which may be deliberately uncorrelated. The two dithering algorithms may be different, but do not have to interact. This may make implementations simpler, for example.

Various examples relate to using dithering to smear out spurs due to repetitive errors due to repetitively interfering digital-to-time converter modules. However this may require that these interferences be detected (e.g. that both digital-to-time converter modules may have selected the same flank in their coarse stages) in order to be able to counteract these instances similarly to the quantization error. This may requires a tight coupling of the two digital-to-time converter modules involving high rate signals which is a disadvantage. Either digital-to-time converter modules have to be placed close together worsening their interference, or high rate busses may have to be laid across the chip, costing area, power and also causing interference).

In some examples, blocking capacitors may be implemented to blocking ripples on VCC. In addition, independent power sources may be provided. e.g. multiple LDOs. However, these may be expensive both on chip (capacitors need to be big to provide sufficient capacitance to avoid any ripple) and off chip due to extra pad(s) and components.

Aspects and features (e.g. the apparatus for providing oscillator signals, the first digital-to-time converter module, the second digital-to-time converter module, the first processing module, the second processing module, the first input signal, the first adapted input signal, the second input signal, the second adapted input signal, the uncorrelated noise, the coarse temporal delay module, the fine temporal delay module, the noise shaping module, the first mixer module, the second mixer module, the base band processor module) mentioned in connection with one or more specific examples may be combined with one or more of the other examples.

An oscillator signal may be a signal to be generated by a circuitry for being transmitted as radio frequency (RF) signals. The oscillator signal may be generated on the final RF frequency, or on another frequency and be transferred to the final transmit frequency in a later step e.g. by mixing. The oscillator signal may be modulated either in phase or amplitude or both, at least the phase modulation may be achieved via a digital-to-time converter module.

The course oscillator signal may be an intermediate course oscillator signal used to derive an oscillator signal. The period of the course oscillator signal or oscillator signal may be an indication of the time resolution with which the course oscillator signal or oscillator signal are generated, it may also be called the resolution or granularity (e.g. temporal resolution or granularity) of the course oscillator signal or oscillator signal or the corresponding circuits generating them. This accuracy of the coarse or fine oscillator signals may also be characterized by the (coarse or fine) oscillator frequency, which may be related to the inverse of the (coarse or fine) oscillator period. For example this may be the period or frequency of a reference oscillator signal that is fed to some components of the (coarse or fine) digital-to-time converter module or is generated therein, but depending on the implementation of the digital-to-time converter that frequency may just be a characterization of the digital-to-time converter module without having to be explicitly provided to it.

In the following, examples pertain to further examples. Example 1 is an apparatus for providing oscillator signals, comprising a first digital-to-time converter module configured to generate a first oscillator signal based on a first adapted input signal. The apparatus further comprises a second digital-to-time converter module configured to generate a second oscillator signal. The apparatus further comprises a first processing module configured to generate the first adapted input signal of the first digital-to-time converter module by adding noise to a first input signal.

In example 2, the subject-matter of example 1 can optionally include the first input signal being a digital signal comprising successive control bit sequences for controlling a variable temporal delay of the first digital-to-time converter module.

In example 3, the subject-matter of example 2 can optionally include the added noise changing at least one bit of the control bit sequences of the first input signal comprising information for setting a fine temporal delay.

In example 4, the subject-matter of example 2 or 3 can optionally include the added noise changing one or more least significant bits of the control bit sequences, wherein the least significant bits are provided to control a fine temporal delay module of the first digital-to-time converter module.

In example 5, the subject-matter of any of examples 2 to 4, can optionally include the added noise changing one or more most significant bits of the control bit sequences, wherein the most significant bits are provided to control a coarse temporal delay module of the first digital-to-time converter module.

In example 6, the subject-matter of any of examples 2 to 5 can optionally include one or more least significant bits of the control bit sequences or one or more most significant bits of the control bit sequences is changed by a random number or a pseudo-random number to add the noise In example 7, the subject-matter of any of examples 2 to 4 can optionally include the added noise leaving unchanged one or more most significant bits of the control bit sequences, wherein the most significant bits comprise information to control a coarse temporal delay module of the first digital-to-time converter module.

In example 8, the subject-matter of any of the previous examples can optionally include the first digital-to-time converter module being configured to generate the first oscillator signal and the second digital-to-time converter module being configured to generate the second oscillator signal based on a same reference oscillator signal.

In example 9, the subject-matter of any of the previous examples can optionally include the first processing module comprises a noise shaping module for generating the noise to be added to the first input signal.

In example 10, the subject-matter of any of the previous examples can optionally include the apparatus further comprising a second processing module configured to generate a second adapted input signal by adding noise to a second input signal, wherein the second digital-to-time converter module is configured to generate the second oscillator signal based on the second adapted input signal.

In example 11, the subject-matter of example 10 can optionally include the noise added to the first input signal and the noise added to the second input signal being uncorrelated.

In example 12, the subject-matter of example 11 can optionally include the first processing module being configured to perform scrambling or ciphering of the first input signal and the second processing module being configured to perform a different scrambling or ciphering of the second input signal to generate the uncorrelated noise.

In example 13, the subject-matter of example 11 or 12 can optionally include the first processing module comprising a first noise shaping module and the second processing module comprising a second noise shaping module, wherein the first noise shaping module and the second noise shaping module are configured to generate uncorrelated noise in the first adapted input signal and the second adapted input signal.

In example 14, the subject-matter of example 13 can optionally include the first noise shaping module and the second noise shaping module each comprising a feedback loop.

In example 15, the subject-matter of example 13 or 14 can optionally include the first noise shaping module being configured to generate noise based on a first noise sequence and the second noise shaping module being configured to generated noise based on a second noise sequence, wherein the first noise sequence and the second noise sequence represent different additive white Gaussian noise or pseudo random binary sequences.

In example 16, the subject-matter of any of examples 13 to 15 can optionally include the first noise shaping module and the second noise shaping module being configured to generate noise based on different look-up tables.

In example 17, the subject-matter of any of examples 13 to 16 can optionally include the first noise shaping module and the second noise shaping module being configured to generate noise based on different seed values or different cycle lengths.

In example 18, the subject-matter of any of examples 13 to 18 can optionally include the first noise shaping module being configured to generate noise based on a first dithering algorithm and the second noise shaping module being configured to generate noise based on a second dithering algorithm, wherein the first dithering algorithm and the second dithering algorithm are different.

In example 19, the subject-matter of any of examples 13 to 19 can optionally include the first dithering signal and the second dithering signal being added at different positions within the first noise shaping module and the second noise shaping module respectively.

In example 20, the subject-matter of any of examples 13 to 19 can optionally include the first noise shaping module and the second noise shaping module being identical noise shaping modules.

In example 21, the subject-matter of any of examples 13 to 19 can optionally include the first noise shaping module and the second noise shaping module each comprising different feedback filters to generate the uncorrelated noise.

In example 22, the subject-matter of any of the previous examples can optionally include the first digital-to-time converter module comprising a coarse temporal delay module configured to generate at least one coarse delay oscillator signal associated with a coarse oscillator frequency, and a fine temporal delay module configured to generate the first oscillator signal having a variable temporal delay based on the at least one coarse delay oscillator signal and a fine temporal delay.

In example 23, the subject-matter of example 22 can optionally include the coarse temporal delay module being configured to provide the at least one coarse delay oscillator signal, wherein a period of the at least one coarse delay oscillator signal comprises a coarse temporal delay based on the added noise changing at least one bit of a control bit sequence of the first input signal.

In example 24, the subject-matter of example 22 or 23 can optionally include the coarse temporal delay module being configured to generate the at least one course oscillator signal based on a reference oscillator signal, wherein the period of the course oscillator signal is equal to the period of the reference oscillator signal or longer only.

In example 25, the subject-matter of example 22 or 23 can optionally include the coarse temporal delay module being configured to generate the at least one course oscillator signal based on a reference oscillator signal, wherein the coarse oscillator frequency is a sub-harmonic of a frequency of the reference oscillator signal.

In example 26, the subject-matter of any of examples 22 to 25 can optionally include the fine temporal delay module comprising a plurality of inverter circuits or a digitally controlled edge interpolator.

In example 27, the subject-matter of any of examples 22 to 26 can optionally include the fine temporal delay module being controlled by the adapted input signal to provide the first oscillator signal adjusted by a fine temporal delay.

In example 28, the subject-matter of any of examples 22 to 27 can optionally include the fine temporal delay being smaller than a minimal period of the coarse delay oscillator signal providable by the coarse temporal delay module.

In example 29, the subject-matter of any of examples 22 to 28 can optionally include the fine temporal delay being between zero and a period of the reference oscillator signal.

Example 30 is an apparatus for providing oscillator signals comprising a first means for digital-to-time conversion configured to generate a first oscillator signal based on a first adapted input signal. The apparatus for providing oscillator signals further comprises a second means for digital-to-time conversion configured to generate a second oscillator signal. The apparatus for providing oscillator signals further comprises a first processing means for generating adapted input signals configured to generate the first adapted input signal of the first means for digital-to-time conversion by adding noise to a first input signal.

In example 31, the subject-matter of example 30 can optionally include the first input signal being a digital signal comprising successive control bit sequences for controlling a variable temporal delay of the first digital-to-time converter module.

In example 32, the subject-matter of example 30 or 31 can optionally include one or more least significant bits of the control bit sequences being changed by a random number or a pseudo-random number to add the noise.

In example 33, the subject-matter of any of examples 30 to 32 can optionally include the first means for digital-to-time conversion being configured to generate the first oscillator signal and the second means for digital-to-time conversion being configured to generate the second oscillator signal based on a same reference oscillator signal.

In example 34, the subject-matter of any of examples 30 to 33 can optionally include a second processing means for generating adapted input signals configured to generate a second adapted input signal by adding noise to a second input signal, wherein the second means for digital-to-time conversion is configured to provide the second oscillator signal based on the second adapted input signal.

In example 35, the subject-matter of example 34 can optionally include the noise added to the first input signal and the noise added to the second input signal being uncorrelated.

Example 36 is a transmitter comprising a first mixer module configured to generate a first radio frequency transmit signal by mixing a first amplitude signal with an oscillator signal. The transmitter further comprises a second mixer module configured to generate a second radio frequency transmit signal by mixing a second amplitude signal with a second oscillator signal. The transmitter further comprises an apparatus for providing oscillator signals according to any of the previous claims configured to generate the first oscillator signal and the second oscillator signal.

Example 37 is a transmitter, a receiver or a transceiver comprising an apparatus according to any of the previous examples.

Example 38 is a mobile device comprising a transmitter, a receiver or a transceiver according to example 37.

Example 39 is a method for providing oscillator signals, the method comprising generating by a first processing module a first adapted input signal by adding noise to a first input signal. The method further comprises generating by a first digital-to-time converter module a first oscillator signal based on the first adapted input signal. The method further comprises generating by a second digital-to-time converter module a second oscillator signal.

In example 40, the subject-matter of example 39 can optionally include adding noise to change at least one bit of the control bit sequences of the first input signal comprising information for setting a fine temporal delay.

In example 41, the subject-matter of example 39 or 40 can optionally include changing one or more least significant bits of control bit sequences of the input signal by a random number or a pseudo-random number to add the noise.

In example 42, the subject-matter of any of examples 39 to 41 can optionally include generating the first oscillator signal and the second oscillator signal based on a same reference oscillator signal.

In example 43, the subject-matter of any of examples 39 to 42 can optionally include generating by a second processing module a second adapted input signal by adding noise to a second input signal, and providing by the second digital-to-time converter module the second oscillator signal based on the second adapted input signal.

In example 44, the subject-matter of example 43 can optionally include the noise added to the first input signal and the noise added to the second input signal being uncorrelated.

Example 45 is a machine readable storage medium including program code, which when executed, causes a machine to perform the method of any of the examples 39 to 44.

Example 46 is a machine readable storage including machine readable instructions, which when executed, implements a method or realize an apparatus as claimed in any previous example.

Example 47 is a computer program having a program code for performing the method of any of the examples 39 to 44 when the computer program is executed on a computer or processor.

Examples may further provide a computer program having a program code for performing one of the above methods, when the computer program is executed on a computer or processor. A person of skill in the art would readily recognize that steps of various above-described methods may be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

What is claimed is:

1. An apparatus for providing oscillator signals, comprising:
   a first digital-to-time converter module configured to generate a first oscillator signal based on a first adapted input signal;
   a second digital-to-time converter module configured to generate a second oscillator signal; and
   a first processing module configured to generate the first adapted input signal of the first digital-to-time converter module by adding noise to a first input signal.

2. The apparatus according to claim 1, wherein the first input signal is a digital signal comprising successive control bit sequences for controlling a variable temporal delay of the first digital-to-time converter module.

3. The apparatus according to claim 2, wherein the added noise changes at least one bit of the control bit sequences of the first input signal comprising information for setting a fine temporal delay.

4. The apparatus according to claim 2, wherein the added noise changes one or more least significant bits of the control bit sequences, wherein the least significant bits are provided to control a fine temporal delay module of the first digital-to-time converter module.

5. The apparatus according to claim 2, wherein the added noise changes one or more most significant bits of the control bit sequences, wherein the most significant bits are provided to control a coarse temporal delay module of the first digital-to-time converter module.

6. The apparatus according to claim 2, wherein one or more least significant bits of the control bit sequences or one or more most significant bits of the control bit sequences is changed by a random number or a pseudo-random number to add the noise.

7. The apparatus according to claim 2, wherein the added noise leaves unchanged one or more most significant bits of the control bit sequences, wherein the most significant bits comprise information to control a coarse temporal delay module of the first digital-to-time converter module.

8. The apparatus according to claim 1, wherein the first digital-to-time converter module is configured to generate the first oscillator signal and the second digital-to-time converter module is configured to generate the second oscillator signal based on a same reference oscillator signal.

9. The apparatus according to claim 1, wherein the first processing module comprises a noise shaping module for generating the noise to be added to the first input signal.

10. The apparatus according to claim 1, further comprising a second processing module configured to generate a second adapted input signal by adding noise to a second input signal, wherein the second digital-to-time converter module is configured to provide the second oscillator signal based on the second adapted input signal.

11. The apparatus according to claim 10, wherein the noise added to the first input signal and the noise added to the second input signal are uncorrelated.

12. The apparatus according to claim 11, wherein the first processing module is configured to perform scrambling or ciphering of the first input signal and the second processing module is configured to perform a different scrambling or ciphering of the second input signal to generate the uncorrelated noise.

13. The apparatus according to claim 11, wherein the first processing module comprises a first noise shaping module and the second processing module comprises a second noise shaping module, wherein the first noise shaping module and the second noise shaping module are configured to generate uncorrelated noise in the first adapted input signal and the second adapted input signal.

14. The apparatus according to claim 13, wherein the first noise shaping module and the second noise shaping module each comprises a feedback loop.

15. The apparatus according to claim 13, wherein the first noise shaping module is configured to generate noise based on a first noise sequence and the second noise shaping module is configured to generated noise based on a second noise sequence, wherein the first noise sequence and the second noise sequence represent different additive white Gaussian noise or pseudo random binary sequences.

16. The apparatus according to claim 13, wherein the first noise shaping module and the second noise shaping module are configured to generate noise based on different look-up tables.

17. The apparatus according to claim 13, wherein the first noise shaping module and the second noise shaping module are configured to generate noise based on different seed values or different cycle lengths.

18. The apparatus according to claim 13, wherein the first noise shaping module is configured to generate noise based on a first dithering algorithm and the second noise shaping module is configured to generate noise based on a second dithering algorithm, wherein the first dithering algorithm and the second dithering algorithm are different.

19. The apparatus according to claim 13, wherein the first dithering signal and the second dithering signal are added at different positions within the first noise shaping module and the second noise shaping module respectively.

20. The apparatus according to claim 13, wherein the first noise shaping module and the second noise shaping module are identical noise shaping modules.

21. The apparatus according to claim 13, wherein the first noise shaping module and the second noise shaping module each comprise different feedback filters to generate the uncorrelated noise.

22. The apparatus according to claim 1, wherein the first digital-to-time converter module comprises a coarse temporal delay module configured to generate at least one coarse delay oscillator signal associated with a coarse oscillator frequency, and a fine temporal delay module configured to generate the first oscillator signal having a variable temporal delay based on the at least one coarse delay oscillator signal and a fine temporal delay.

23. The apparatus according to claim 22, wherein the coarse temporal delay module is configured to provide the at least one coarse delay oscillator signal, wherein a period of the at least one coarse delay oscillator signal comprises a coarse temporal delay based on the added noise changing at least one bit of a control bit sequence of the first input signal.

24. A method for providing oscillator signals, comprising:
generating by a first processing module a first adapted input signal by adding noise to a first input signal;
providing by a first digital-to-time converter module a first oscillator signal based on the first adapted input signal; and
providing by a second digital-to-time converter module a second oscillator signal.

25. A non-transitory machine readable storage medium including program code comprising executed instructions, when executed by a processor or a computer, to cause a device or machine to perform the method of claim 24.

* * * * *